United States Patent
Ahmed et al.

(10) Patent No.: US 10,145,736 B2
(45) Date of Patent: Dec. 4, 2018

(54) BIAS CURRENTS TO REVERSE-BIAS PHOTODIODE IN LIGHT DETECTION SYSTEM

(71) Applicant: TEXAS INSTRUMENTS INCORPORATED, Dallas, TX (US)

(72) Inventors: Hussam Ahmed, Calicut (IN); Jagannathan Venkataraman, Bangalore (IN); Sandeep Kesrimal Oswal, Bangalore (IN); Hari Babu Tippana, Andhra Pradesh (IN); Anand Hariraj Udupa, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 58 days.

(21) Appl. No.: 15/491,729

(22) Filed: Apr. 19, 2017

(65) Prior Publication Data

US 2017/0299429 A1    Oct. 19, 2017

(30) Foreign Application Priority Data

Apr. 19, 2016   (IN) .............................. 201641013527

(51) Int. Cl.
   *G01J 1/44*      (2006.01)
   *H01L 31/101*    (2006.01)
   *H01L 31/107*    (2006.01)

(52) U.S. Cl.
   CPC .............. *G01J 1/44* (2013.01); *H01L 31/107* (2013.01); *G01J 2001/444* (2013.01); *G01J 2001/446* (2013.01)

(58) Field of Classification Search
   CPC ........ H01L 31/107; H01L 31/101; G01J 1/44; G01J 2001/446; H03F 3/08; H02M 3/156
   USPC ......................................... 250/214 R, 214 A
   See application file for complete search history.

(56) References Cited

U.S. PATENT DOCUMENTS 6,307,196 B1 *  10/2001  Thompson ................ G01J 1/44
                                                    250/214 A

* cited by examiner

*Primary Examiner* — Que T Le
(74) *Attorney, Agent, or Firm* — John R. Pessetto; Charles A. Brill; Frank D. Cimino

(57) ABSTRACT

At least some embodiments are directed to a light detection system comprising a photodiode, a transimpedance amplifier (TIA) having a differential output and a differential input coupled across the photodiode, a first bias current source coupled to an anode of the photodiode, and a second bias current source coupled to a cathode of the photodiode. The system also comprises a dynamic control logic coupled to the first and second bias current sources and configured to vary bias currents provided by the first and second bias current sources based on the differential output such that the photodiode is reverse-biased.

20 Claims, 2 Drawing Sheets

BIAS CURRENTS TO REVERSE-BIAS PHOTODIODE IN LIGHT DETECTION SYSTEM

CROSS-REFERENCE TO RELATED APPLICATIONS

This application claims priority to Indian Provisional App. No. 201641013527, which was filed on Apr. 19, 2016 and is incorporated herein by reference.

BACKGROUND

Various types of electronic devices, such as heart rate monitors and peripheral capillary oxygen saturation (SpO2) monitors, perform functions that require both the emission and detection of light. For example, heart rate monitors may emit light (using, e.g., light-emitting diodes (LEDs)) in the direction of the human body and may detect the light that has reflected back toward the monitor. In such electronic devices, reflected light may be detected using photodiodes, which produce current as a function of the intensity of detected light. The photodiodes, however, detect ambient light in addition to reflected light generated by the electronic devices. The electronic devices attempt to cancel ambient light to the extent possible.

SUMMARY

At least some embodiments are directed to a light detection system comprising a photodiode, a transimpedance amplifier (TIA) having a differential output and a differential input coupled across the photodiode, a first bias current source coupled to an anode of the photodiode, and a second bias current source coupled to a cathode of the photodiode. The system also comprises a dynamic control logic coupled to the first and second bias current sources and configured to vary bias currents provided by the first and second bias current sources based on the differential output such that the photodiode is reverse-biased.

At least some embodiments are directed to a light detection system comprising a photodiode, an analog-to-digital converter (ADC), a transimpedance amplifier (TIA) having a differential input coupled to the photodiode and having a differential output that is input to the ADC and a pair of feedback resistors coupled between the TIA differential input and differential output. The system also comprises multiple bias current sources coupled to the photodiode and a dynamic control logic coupled to the multiple bias current sources and configured to adjust bias currents provided by the multiple bias current sources to reverse-bias the photodiode. The dynamic control logic is configured to adjust the bias currents based on at least one of the differential output of the TIA and an output of the ADC.

At least some embodiments are directed to a method comprising receiving light at a photodiode, generating a current through the photodiode based on an intensity of the received light, and producing a differential output from a transimpedance amplifier (TIA) based at least in part on the current generated by the photodiode as detected by a differential input of the TIA. The method also comprises comparing an indication of the differential output to a threshold and adjusting a bias current provided to the photodiode based on the comparison so that the photodiode is reverse-biased.

BRIEF DESCRIPTION OF THE DRAWINGS

For a detailed description of various examples, reference will now be made to the accompanying drawings in which.

DETAILED DESCRIPTION

Figure 1:
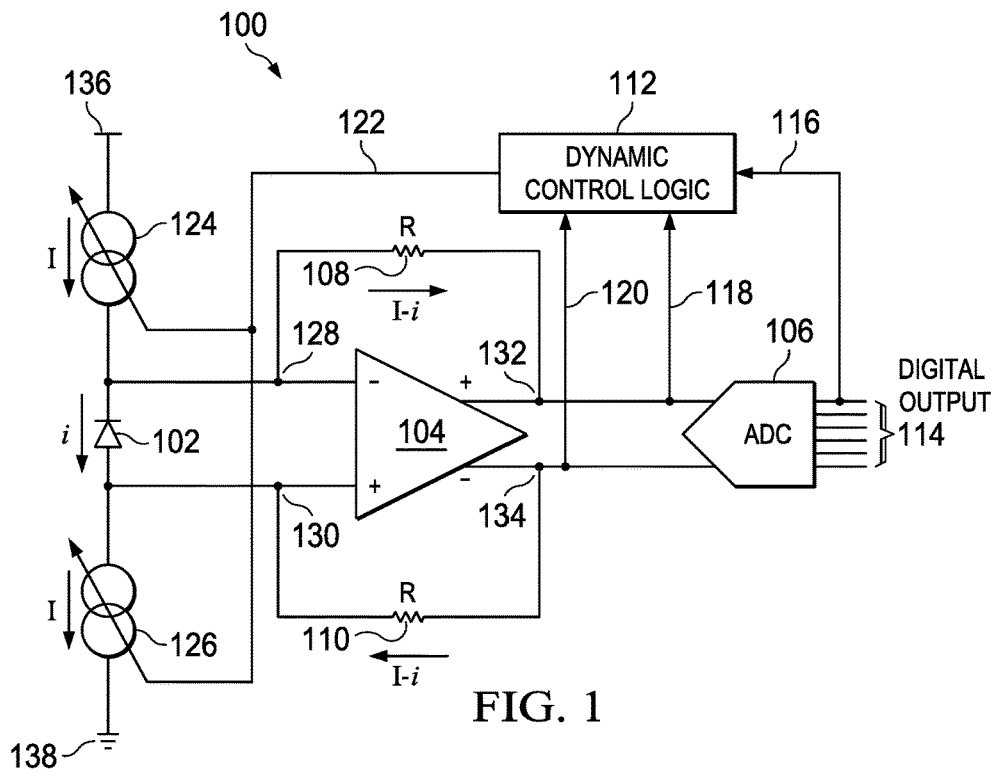
FIG. 1 is a circuit schematic diagram of an illustrative light detection system.

Electronic devices like those mentioned above may contain light detection systems with photodiodes. Such light detection systems may measure light in two separate phases: a light-emitting diode (LED) phase and an ambient light (AMB) phase that immediately follows the LED phase. During the LED phase, the light detection system may detect both ambient light and light emitted by the light detection system—for example, LED light that is reflected from the human body. During the AMB phase, only ambient light may be detected. Light data detected during the AMB phase may be subtracted from light data detected during the LED phase in an attempt to isolate the light generated by the electronic device and reflected from the human body, since only the reflected LED light contains the desired data.

The photodiode current generated during the LED phase may have a substantial direct current (DC) component compared to the AMB phase due to the reflection of LED light from the human body. Any alternating component in the ambient light may be converted to an alternating current (AC) by the photodiode in both LED and AMB phases. However, the amplitude of the AC ambient current in the LED phase may be slightly different from the amplitude of the AC current in the AMB phase. This is due to the non-linear behavior of the photodiode. Accordingly, subtracting the current generated during the AMB phase from the current generated during the LED phase still may leave a residual AC component that may degrade system performance, particularly if the ambient AC frequency is close to the frequency of the desired signal.

In addition, the photodiode has a time constant that characterizes the time delay between light detection and current output. This time constant should be low compared to the separation between the LED and AMB phases. A high time constant may result in leakage of current from the LED phase into the AMB phase, which, in turn, may result in attenuation of the data signal of interest that is generated by the LED and reflected by the human body during the aforementioned subtraction of the AMB phase current from the LED phase current. This leakage may be reduced by increasing the time distance between the LED and AMB phases, but this measure undesirably reduces the degree of ambient light cancellation.

Each of these issues may be mitigated by ensuring that the photodiode remains in a reverse-bias mode. Specifically, the photodiode response time is determined in substantial part by the diode junction capacitance, which is inversely proportional to the square root of the applied reverse bias. Thus, operating the photodiode in reverse bias improves its response time. Additionally, the linearity of the photodiode response has been experimentally proven to improve when the photodiode is operated in a reverse bias mode. Accordingly, at least some embodiments in this disclosure are directed to maintaining the photodiode in a reverse bias mode so that the foregoing issues are mitigated. Specifically, various embodiments are disclosed in which bias current sources are coupled to the photodiode and in which a dynamic control logic uses feedback information to dynamically adjust bias currents provided by the bias current sources to maintain the photodiode in a reverse-bias mode.

FIG. 1 is a circuit schematic diagram of an illustrative light detection system 100. The system 100 may comprise a photodiode 102; a transimpedance amplifier (TIA) 104; an analog-to-digital converter (ADC) 106; a feedback resistor 108 (e.g., 50 kOhms); a feedback resistor 110 that may be identical in resistance to the feedback resistor 108; a dynamic control logic (DCL) 112; a digital output 114 of the ADC 106; a digital feedback signal 116; analog feedback signals 118 and 120; a current control signal 122; current sources 124 and 126; differential TIA inputs 128 and 130; differential TIA outputs 132 and 134; a voltage rail connection 136; and a ground connection 138.

The operation of the system 100 may be explained by first assuming bias currents of 0 uA, and then by assuming variable bias currents as controlled by the DCL 112. Assuming, then, that the bias currents provided by the bias current sources 124 and 126 are 0 uA, the photodiode 102 may receive light, such as ambient light or LED light, and it may permit a reverse current (from cathode to anode) to flow through the photodiode 102 that is generally commensurate with the intensity of the light that is received. FIG. 1 uses i to denote the total current flowing through the photodiode 102. As current i begins to flow through the photodiode 102, the photodiode 102 begins to be slightly forward-biased, which is undesirable for at least the reasons provided above. This forward-biasing may occur because as the current that is generated in the photodiode flows through the feedback resistors 108 and 110, causing the TIA output 132 to have a higher voltage than the TIA output 134. Because the TIA 104 may comprise an inverting amplifier with a finite open loop gain (hereinafter referred to as gain A), the TIA input 130 may have a higher voltage than the TIA input 128. As a result, the voltage at the photodiode 102 anode is higher than the voltage at the photodiode cathode, causing the photodiode 102 to be forward biased.

Such forward biasing also may occur or be exacerbated by the presence of one or more switches in the system 100—for example, between the TIA 104 and the anode and/or cathode of the photodiode 102. Such switches, which may take the form of transistors, may be used in systems comprising multiple light detection systems 100 that must be multiplexed. These switches may cause voltage drops as current flows through them, resulting in additional forward biasing of the photodiode 102.

To counter these forward-biasing effects, the DCL 112 may monitor an indication of the output of the TIA 104 (e.g., the analog output of the TIA 104 as determined based on the analog feedback signals 118 and 120, or the digital output 114 of the ADC 106 as determined based on the digital feedback signal 116). When the DCL 112 determines that the output of the TIA 104—again, as determined based on the analog feedback signals 118 and 120 or the digital feedback signal 116—is such that the photodiode 102 is forward-biased, the DCL 112 may adjust the bias currents provided by the bias current sources 124 and 126 using the current control signal 122.

Assuming now that the bias currents provided by the bias current sources 124 and 126 are no longer 0 uA but are greater than 0 uA, the biasing of the photodiode 102 may begin to change. Specifically, and still referring to FIG. 1, a bias current I provided by the bias current source 124 may flow toward the node to which the cathode of the photodiode 102 couples. The current that flows through the feedback resistor 108, therefore, may be expressed as the difference between the bias current I and the photodiode 102 current i. This current may flow toward the TIA output 132. Similarly, a bias current I provided by the bias current source 126 may flow away from the node to which the anode of the photodiode 102 couples. The current that flows through the feedback resistor 110, therefore, may be expressed as the difference between the bias current I and the photodiode 102 current i. This current, however, may flow away from the TIA output 134. As the bias currents I increase, the current flowing toward the TIA output 132 may increase and the current flowing away from the TIA output 134 may increase, and the opposite may be true when the bias currents I decrease. The current that flows through the feedback resistor 108 may be multiplied by the resistance R of the feedback resistor 108 to produce the voltage by which the output voltage at the TIA output 132 is stepped down. Conversely, the current that flows through the feedback resistor 110 may be multiplied by the resistance R of the feedback resistor 110 to produce the voltage by which the output voltage at the TIA output 134 is stepped up. Thus, the net effect of the foregoing is that as the bias currents I increase, the output voltage at the TIA output 132 may decrease and the output voltage at the TIA output 134 may increase. The differential voltage at the output of the TIA 104 (e.g., the voltage at the TIA output 132 minus the voltage at the TIA output 134) may thus move in a negative direction as the bias currents I increase and move in a positive direction as the bias currents I decrease. The bias current I may be set such that the difference between TIA output 132 and 134 is negative. Stated in another way, the direction of the current that is flowing through the TIA 104 may be reversed with respect to the case where no bias currents are supplied. This may cause a reverse bias to develop across the photodiode 102.

In an effort to maintain the photodiode 102 in the reverse bias mode, the DCL 112 may monitor the analog feedback signals 118 and 120 and/or the digital feedback signal 116. When the differential between the analog feedback signals 118 and 120 meets or exceeds a threshold, the photodiode 102 may no longer be in a reverse bias mode, and so the DCL 112 may increase the bias currents I by the bias current sources 124 and 126 until the differential is once again below the threshold. Similarly, in some embodiments, if the DCL 112 determines that the digital feedback signal 116 meets or exceeds a threshold, the photodiode 102 may no longer be in a reverse bias mode, and so the DCL 112 may increase the bias currents I output by the bias current sources 124 and 126 until the digital feedback signal 116 is below the threshold. Because the photodiode 102 current i may include an AC component, it may fluctuate, and so the currents I-i flowing through the feedback resistors 108 and 110 also may fluctuate. As a result, the differential voltages at the TIA outputs 132, 134 also may fluctuate. In some cases, this fluctuation may result in the differential between the analog feedback signals 118, 120 at times meeting or exceeding the threshold and at times falling below the threshold. In such instances, the DCL 112 may continue to raise the bias currents I until the feedback signals consistently remain below the threshold (or for at least a predetermined length of time). In at least some embodiments, the bias currents I are held so that the feedback signals are just below (e.g., 5% below) the threshold value, thus maintaining the photodiode 102 in a reverse bias mode without unnecessarily consuming power by providing excessively high bias currents I. In at least some embodiments, the system 100 may require bias currents I greater than the following expression to maintain the photodiode 102 in reverse bias mode:

$$\frac{AV_{min}}{2R} + i$$

where A is a finite open loop gain of the TIA (e.g., TIA 104), R is a resistance of a feedback resistor coupled between the differential input and differential output of the TIA 104 (e.g., resistors 108 and 110), i is a total current (including DC and AC components) flowing through the photodiode (e.g., photodiode 102), and $V_{min}$ is a minimum voltage across the photodiode necessary to reverse-bias the photodiode.

In this way, the photodiode 102 is kept in a reverse bias mode, thus to at least some extent mitigating the aforementioned problems that occur in the forward bias mode. In addition to being used for feedback purposes, the digital output 114 may be provided to other circuitry for further processing as desired (e.g., for heart rate determination and subsequent display).

Figure 2:
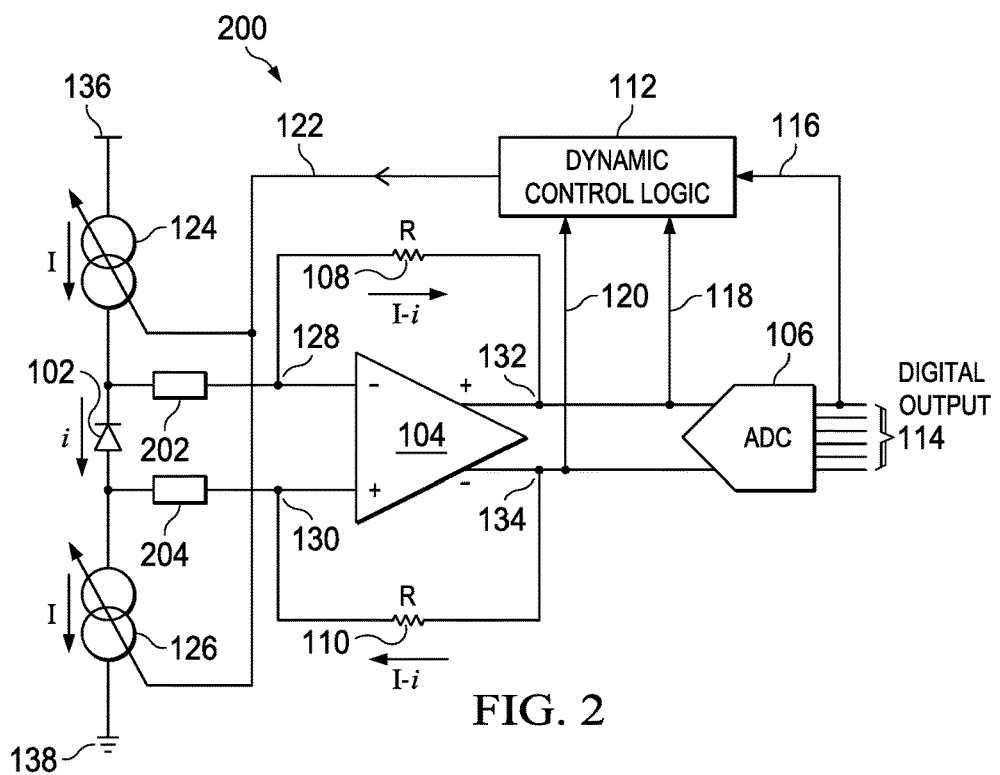
FIG. 2 is a circuit schematic diagram of another illustrative light detection system.

FIG. 2 is a circuit schematic diagram of another illustrative light detection system 200. The light detection system 200 as depicted in FIG. 2 is identical to the light detection system 100 as depicted in FIG. 1 except for the addition of a pair of switches (e.g., transistors) 202 and 204, as shown. These switches may be used, for instances, in applications requiring the multiplexing of multiple light detection systems 200. These switches, when closed, have non-zero resistances and thus develop a forward bias across the photodiode 102 terminals. The DCL 112 may compensate for this forward bias as described above (e.g., by adjusting the bias currents I based on feedback signals). In at least some embodiments, the DCL 112 maintains the photodiode 102 in a reverse bias mode—even when such switches are closed—using the techniques described herein. In such a case, the system 100 may require bias currents I greater than the following expression to maintain the photodiode 102 in reverse bias mode:

$$\frac{AV_{min}}{2R + 2ARs} + i$$

where A is a finite open loop gain of the TIA, R is a resistance of one of the pair of feedback resistors, $R_s$ is a resistance of the switch in series with the photodiode, i is a total current flowing through the photodiode, and $V_{min}$ is a minimum voltage across the photodiode necessary to reverse-bias the photodiode.

Figure 3:
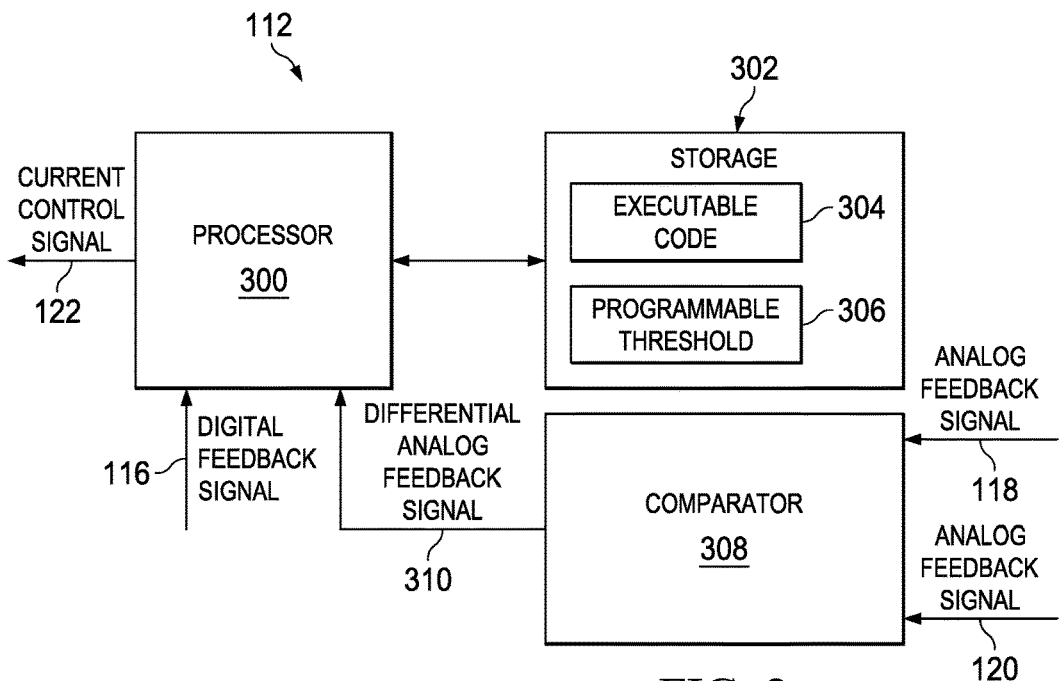
FIG. 3 is a block diagram of an illustrative dynamic control logic.

FIG. 3 is a block diagram of an illustrative dynamic control logic (DCL) 112, such as that depicted in FIGS. 1 and 2. The illustrative DCL 112 comprises a processor 300, storage 302 (e.g., random access memory, read only memory) storing executable code 304 and a programmable threshold 306, and a comparator 308. Other components also may be included. The processor 300 is capable of executing the executable code 304, which, when executed, causes the processor 300 to perform some or all of the actions attributed herein to the DCL 112. The programmable threshold 306 is the threshold described above against which the processor 300 compares the feedback signals from the TIA 104 and/or the ADC 106 to produce the current control signal 122. (The threshold 306 may be programmed at any suitable time or may be pre-programmed prior to deployment of the light detection system 100 in an electronic device.) In particular, the comparator 308 may receive the analog feedback signals 118 and 120 and may produce a differential analog feedback signal 310. The processor 300 may receive this differential analog feedback signal 310. Alternatively or in addition, the processor 300 may receive the digital feedback signal 116 (e.g., from the ADC 106). In some embodiments, the processor 300 may compare either the differential analog feedback signal 310 or the digital feedback signal 116 to the programmable threshold 306. In some embodiments, such a comparison may be performed using one or more additional comparators (not expressly depicted), and the output(s) of such comparator(s) may be provided to the processor 300.

Regardless of the manner in which the processor 300 determines whether the differential analog feedback signal 310 and/or the digital feedback signal 116 is greater than, equal to, or less than the programmable threshold 306, the processor 300 may use the comparison results to adjust the current control signal 122 so that the bias currents I increase, decrease, or remain the same. For instance, if the processor 300 determines that a feedback signal is greater than or equal to the programmable threshold 306, the processor 300 may increase the bias currents I. If the processor 300 determines that the feedback signal is less than the threshold 306 but within a predetermined range of the threshold (e.g., no more than 5% below the threshold), the processor 300 may take no action. If the processor 300 determines that the feedback signal is substantially less than the threshold (e.g., more than 5% below the threshold), the processor 300 may decrease the bias currents I. These adjustments are merely illustrative and, as with all examples provided herein, do not limit the scope of this disclosure.

Figure 4:
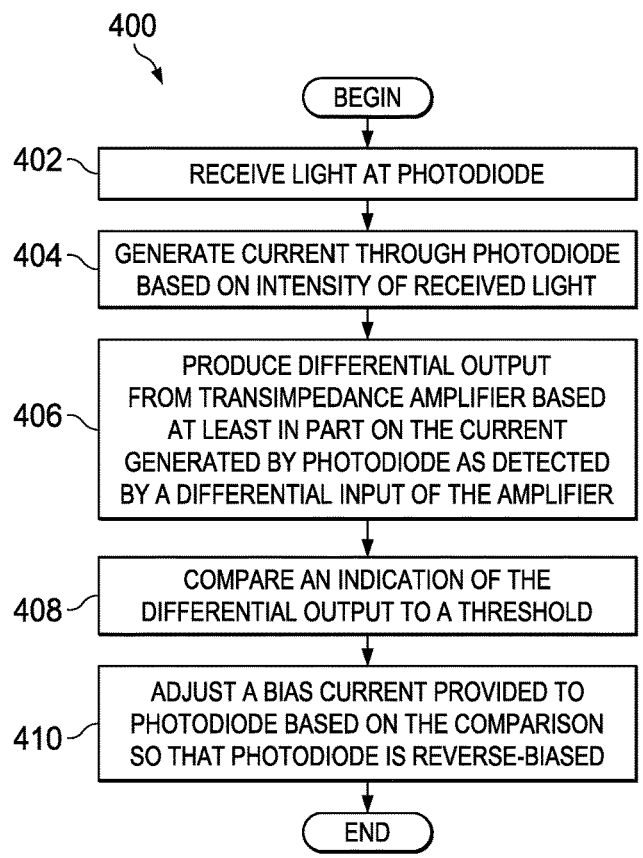
FIG. 4 is a flow diagram of an illustrative method for maintaining a photodiode of a light detection system in a reverse-bias mode.

FIG. 4 is a flow diagram of an illustrative method 400 for maintaining a photodiode of a light detection system in a reverse bias mode. The method 400 may begin with receiving light at a photodiode (step 402), such as the photodiode 102 depicted in FIGS. 1 and 2. The method 400 may continue by generating current through the photodiode based on an intensity of the received light (step 404). The method 400 may next include producing a differential voltage output from the TIA (e.g., TIA 104 in FIGS. 1 and 2) based at least in part on the current generated by the photodiode as detected by a differential input of the amplifier (step 406). As explained above, the differential voltage also may depend on the voltage drops across feedback resistors, such as feedback resistors 108 and 110 in FIGS. 1 and 2. The method 400 may next comprise comparing an indication of the differential output to a threshold (step 408), such as the programmable threshold 306 in FIG. 3. The "indication" of the differential output may, for instance, be the difference between the analog feedback signals 118 and 120, or it may be the digital feedback signal 116. The method 400 may then comprise adjusting bias currents provided to the photodiode based on the comparison so that the photodiode is reverse-biased (step 410). As explained, the processor 300 (FIG. 3) may take a variety of actions, depending on the comparison results of step 408, including increasing the bias currents I, decreasing the bias currents I, or maintaining the bias currents I as they presently are. The method 400 may be adjusted as desired, including by adding, deleting, modifying, or rearranging one or more steps.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A light detection system, comprising:
   a photodiode;
   a transimpedance amplifier (TIA) having a differential output and a differential input coupled across the photodiode;
   a first bias current source coupled to an anode of the photodiode;
   a second bias current source coupled to a cathode of the photodiode; and
   a dynamic control logic coupled to the first and second bias current sources and configured to vary bias currents provided by the first and second bias current sources based on the differential output such that the photodiode is reverse-biased.

2. The system of claim 1, further comprising an analog-to-digital converter (ADC) coupled to the differential output of the TIA and configured to produce a digitized version of the differential output of the TIA.

3. The system of claim 2, wherein the dynamic control logic is configured to vary the bias currents provided by the first and second bias current sources based on the digitized version of the differential output of the TIA.

4. The system of claim 1, wherein the dynamic control logic is configure to vary the bias currents provided by the first and second bias current sources based on a comparison of a threshold value and the differential output of the TIA.

5. The system of claim 4, wherein the dynamic control logic comprises a comparator to produce a differential analog feedback signal based on the differential output, and wherein the dynamic control logic is configured to compare the threshold value and the differential analog feedback signal to vary the bias currents.

6. The system of claim 1, further comprising a pair of feedback resistors coupled between the differential input and the differential output of the TIA.

7. The system of claim 1, further comprising a switch between the anode of the photodiode and the TIA.

8. The system of claim 7, wherein at least one of the bias currents is greater than the expression:

$$\frac{AV_{min}}{2AR_S + 2R} + i$$

where A is a finite open loop gain of the TIA, R is a resistance of a feedback resistor coupled between the differential input and differential output of the TIA, $R_S$ is a resistance of the switch in series with the photodiode, i is a total current flowing through the photodiode, and $V_{min}$ is a minimum voltage across the photodiode necessary to reverse-bias the photodiode.

9. A light detection system, comprising:
   a photodiode;
   an analog-to-digital converter (ADC);
   a transimpedance amplifier (TIA) having a differential input coupled to the photodiode and having a differential output that is input to the ADC;
   a pair of feedback resistors coupled between the TIA differential input and differential output;
   multiple bias current sources coupled to the photodiode; and
   a dynamic control logic coupled to the multiple bias current sources and configured to adjust bias currents provided by the multiple bias current sources to reverse-bias the photodiode,
   wherein the dynamic control logic is configured to adjust the bias currents based on at least one of the differential output of the TIA and an output of the ADC.

10. The system of claim 9, wherein the resistances in the pair of resistors are identical.

11. The system of claim 9, wherein the dynamic control logic is configured to adjust the bias currents based on a comparison of the differential output of the TIA and a threshold and is further configured to adjust the bias currents based on a comparison of the output of the ADC to the threshold.

12. The system of claim 9, wherein the differential input of the TIA couples to both an anode and a cathode of the photodiode.

13. The system of claim 12, further comprising a switch coupled between the anode and the TIA.

14. The system of claim 13, wherein at least one of the bias currents is greater than the expression:

$$\frac{AV_{min}}{2AR_S + 2R} + i$$

where A is a finite open loop gain of the TIA, R is a resistance of one of the pair of feedback resistors, $R_S$ is a resistance of the switch in series with the photodiode, i is a total current flowing through the photodiode, and $V_{min}$ is a minimum voltage across the photodiode necessary to reverse-bias the photodiode.

15. A method, comprising:
   receiving light at a photodiode;
   generating a current through the photodiode based on an intensity of the received light;
   producing a differential output from a transimpedance amplifier (TIA) based at least in part on the current generated by the photodiode as detected by a differential input of the TIA;
   comparing an indication of the differential output to a threshold; and
   adjusting a bias current provided to the photodiode based on the comparison so that the photodiode is reverse-biased.

16. The method of claim 15, wherein the indication comprises an analog output of the TIA.

17. The method of claim 15, further comprising providing the differential output from the TIA to an analog-to-digital converter (ADC), and wherein the indication comprises at least part of an output of the ADC.

18. The method of claim 15, wherein adjusting the bias current comprises adjusting at least one of two bias current sources, a first of the two bias current sources coupled to an anode of the photodiode and a second of the two bias current sources coupled to a cathode of the photodiode.

19. The method of claim 15, further comprising closing a switch positioned between an anode of the photodiode and the TIA without removing the photodiode from the reverse-bias mode.

20. The method of claim 19, wherein adjusting the bias current comprises ensuring that the bias current is greater than the expression:

$$\frac{AV_{min}}{2AR_S + 2R} + i$$

where A is a finite open loop gain of the TIA, R is a resistance of one of a pair of feedback resistors coupled between the differential input and output of the TIA, $R_S$ is a resistance of the switch in series with the photodiode, i is a total current flowing through the photodiode, and $V_{min}$ is a minimum voltage across the photodiode necessary to reverse-bias the photodiode.

\* \* \* \* \*